(12) United States Patent  
Fukuda et al.

(10) Patent No.: US 8,455,324 B2
(45) Date of Patent: *Jun. 4, 2013

(54) METHOD OF MANUFACTURING A SEMICONDUCTOR DEVICE

(75) Inventors: Masahiro Fukuda, Tokyo (JP); Yosuke Shimamune, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 319 days.

This patent is subject to a terminal disclaimer.

(21) Appl. No.: 12/572,702

(22) Filed: Oct. 2, 2009

(65) Prior Publication Data

US 2010/0105184 A1   Apr. 29, 2010

(30) Foreign Application Priority Data

Oct. 27, 2008 (JP) .................................. 2008-275421

(51) Int. Cl.
*H01L 21/336* (2006.01)

(52) U.S. Cl.
USPC ........... 438/300; 438/694; 438/734; 438/753; 257/E21.409

(58) Field of Classification Search
USPC .................................. 438/300, 734, 753, 694
See application file for complete search history.

(56) References Cited

U.S. PATENT DOCUMENTS

| 2007/0102735 A1* | 5/2007 | Kanemoto et al. ............. 257/288 |
| 2008/0023773 A1 | 1/2008 | Shimamune et al. |
| 2008/0128746 A1* | 6/2008 | Wang ............................ 257/190 |
| 2008/0217686 A1* | 9/2008 | Majumdar et al. ............ 257/347 |
| 2012/0108025 A1* | 5/2012 | Fukuda et al. ................ 438/299 |

FOREIGN PATENT DOCUMENTS

| JP | 8-153688 A | 6/1996 |
| JP | 11-008303 A | 1/1999 |
| JP | 2007-250837 A | 9/2007 |
| JP | 2007-305730 A | 11/2007 |
| JP | 2008-34650 A | 2/2008 |

OTHER PUBLICATIONS

Japanese Office Action dated Feb. 26, 2013, issued in corresponding Japanese Patent Application No. 2008-275421, w/ partial English translation.

* cited by examiner

*Primary Examiner* — Alexander Ghyka
(74) *Attorney, Agent, or Firm* — Westerman, Hattori, Daniels & Adrian, LLP

(57) ABSTRACT

A method of manufacturing a semiconductor device which includes forming a gate insulating film and a gate electrode over a semiconductor substrate, forming a first recess in the first semiconductor substrate on both sides of the gate electrode by dry etching, forming a second recess by removing a bottom and sidewalls of the first recess by wet etching, and forming a semiconductor layer in the second recess.

7 Claims, 5 Drawing Sheets

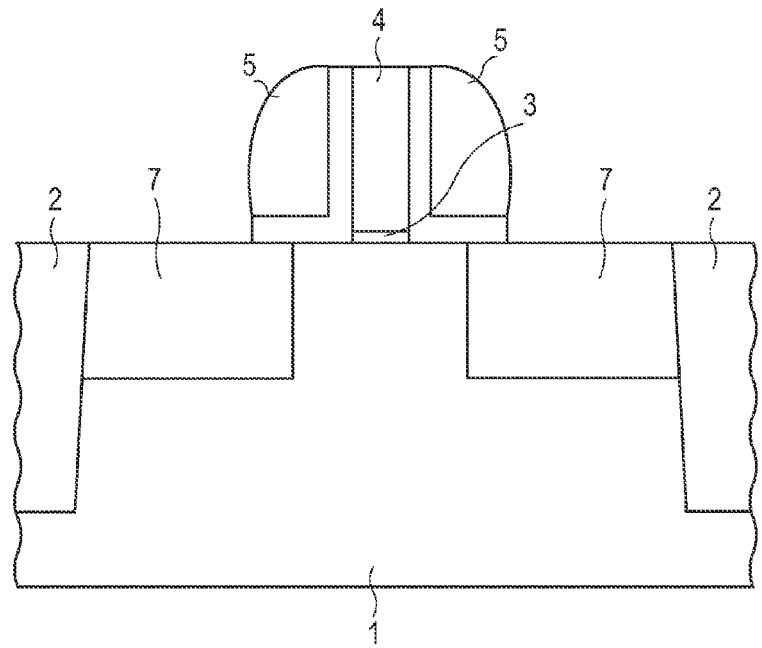
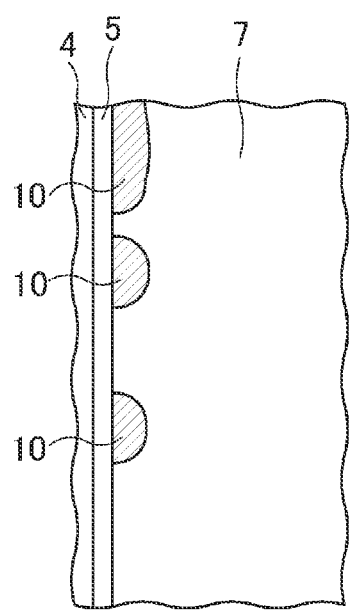
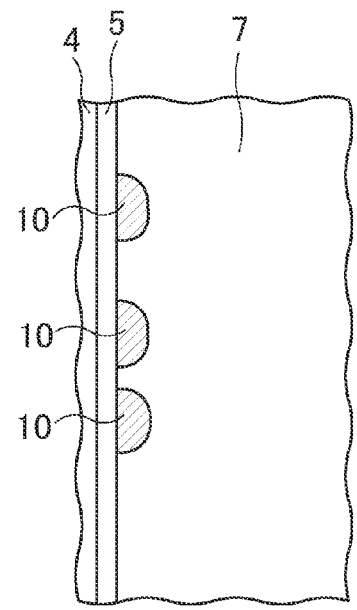
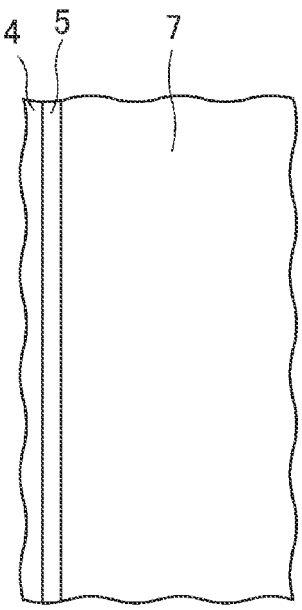

FIG. 8
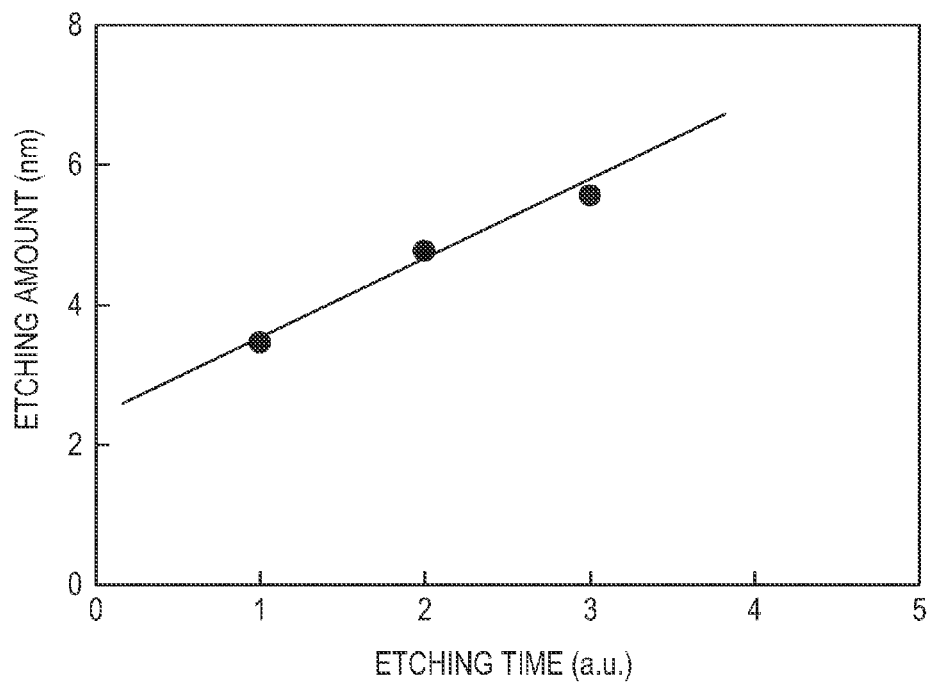
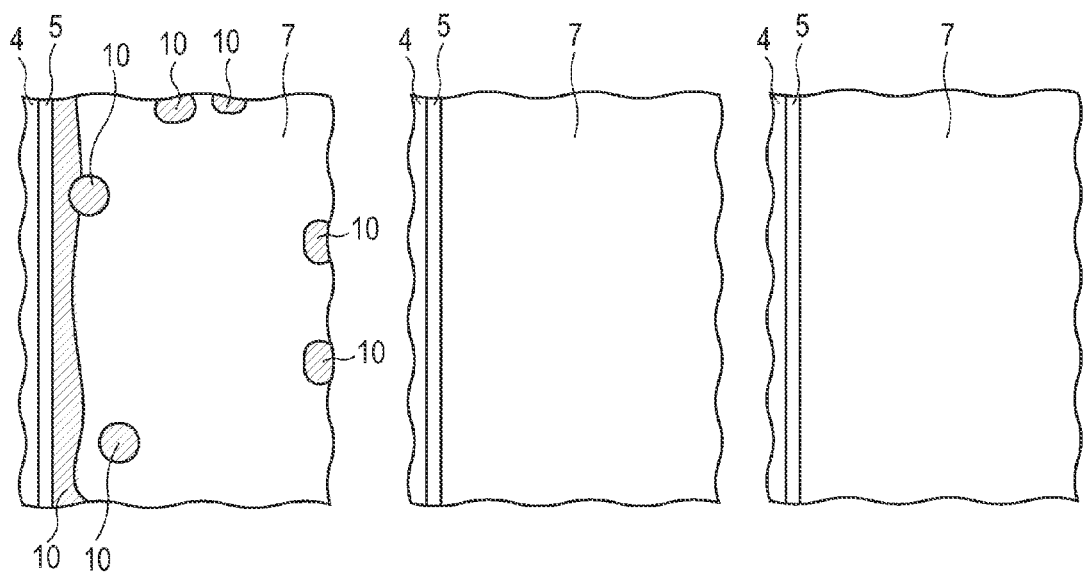
FIG. 9A  FIG. 9B  FIG. 9C

METHOD OF MANUFACTURING A SEMICONDUCTOR DEVICE

CROSS-REFERENCE TO RELATED APPLICATIONS

This application is based upon and claims the benefit of priority from the prior Japanese Patent Application No. 2008-275421, filed on Oct. 27, 2008, the entire contents of which is incorporated herein by reference.

FIELD

The present invention relates to a method of manufacturing a semiconductor device and, more particularly, to a method of manufacturing a semiconductor device utilizing an epitaxial growth method.

BACKGROUND

In recent years, attention has been paid to a recessed source/drain type MOSFET in which a source/drain-region trench (hereinafter referred to as a recess) is formed and a semiconductor layer having a lattice constant different from that of a semiconductor substrate is epitaxially grown in the recess, in order to improve the current driving capability of the MOSFET.

When the recessed source/drain type MOSFET is formed, dry etching is performed to form the recess in the semiconductor substrate and a Chemical Vapor Deposition (CVD) method is used for the epitaxial growth of the semiconductor layer. In addition, Japanese Patent Laid-Open Nos. 08-153688, 2007-305730 and 2007-250837, for example, propose performing treatments to remove contaminants and oxides present on a surface of the recess using a predetermined gas, after the formation of the recess by dry etching and before the epitaxial growth of the semiconductor layer.

SUMMARY

According to an aspect of the invention, a method of manufacturing a semiconductor device includes forming a gate insulating film and a gate electrode over a semiconductor substrate, forming a first recess in the first semiconductor substrate on both sides of the gate electrode by dry etching, forming a second recess by removing a bottom and sidewalls of the first recess by wet etching, and forming a semiconductor layer in the second recess.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 6 illustrates a step of semiconductor layer formation;
FIGS. 7A to 7C are plan views after the growth of a SiGe layer;
FIG. 8 is one example of a relationship between an etching time and the amount of etching;
and
FIGS. 9A to 9C are plan views after the growth of a SiGe layer.

DESCRIPTION OF EMBODIMENTS

When a semiconductor layer is epitaxially grown in a formed recess, the morphology of a growing semiconductor layer may deteriorate in some cases. For example, a dry etching treatment in a step of recess formation may cause deterioration, if crystalline disorder occurs for the reason that for example, gas constituents remain in the recess. Deterioration in the morphology of a semiconductor layer affects the electrical characteristics of an ultimately obtained MOSFET. The deterioration in the morphology of the semiconductor layer also depends on the growth temperature of the semiconductor layer and is more likely to take place in the case of lower-temperature growth.

Figure 1:
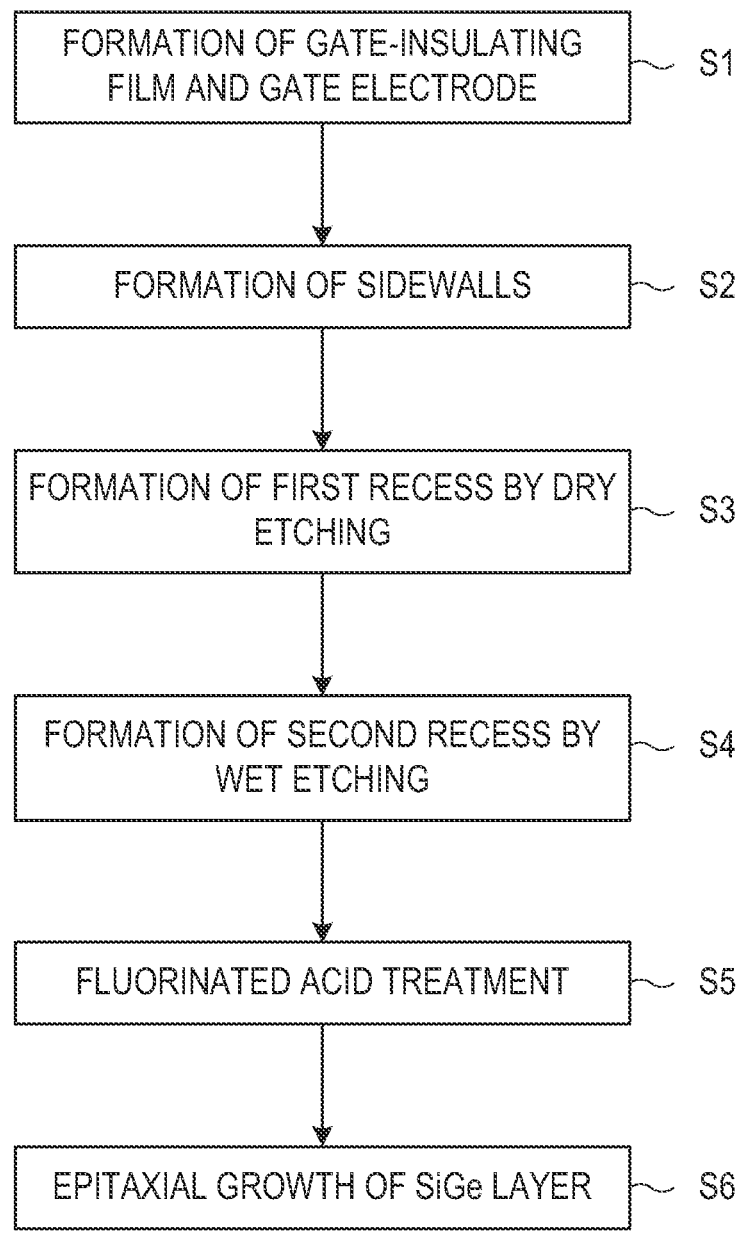
FIG. 1 illustrates one example of a flow of forming a p-channel type MOSFET (pMOSFET)
Figure 2:
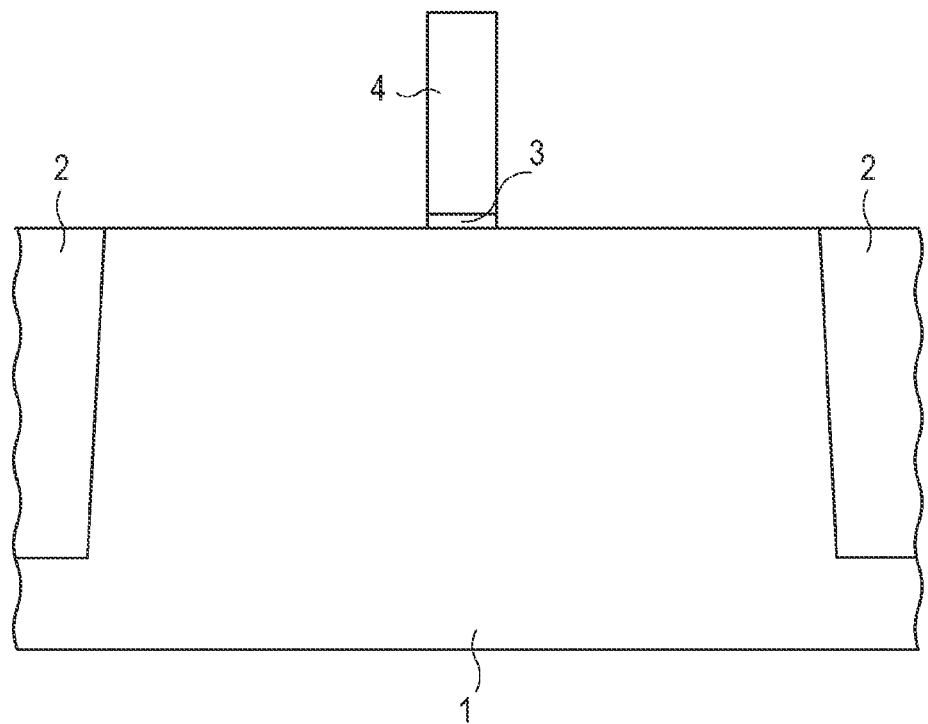
FIG. 2 illustrates a step of gate electrode formation.
Figure 3:
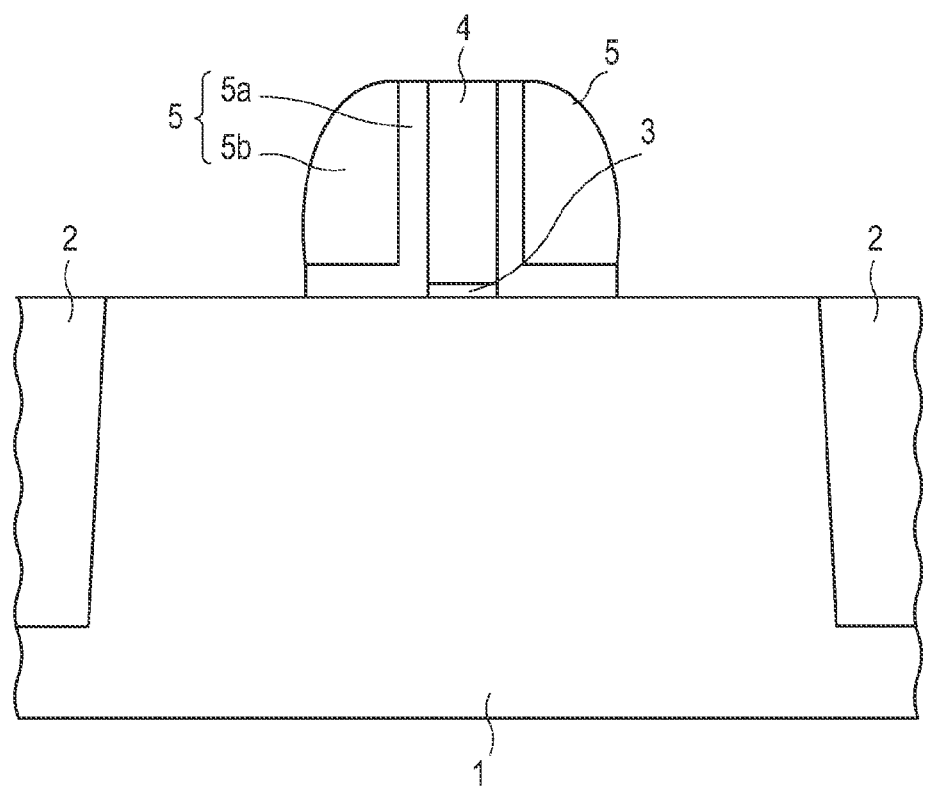
FIG. 3 illustrates a step of sidewall spacer formation.
Figure 4:
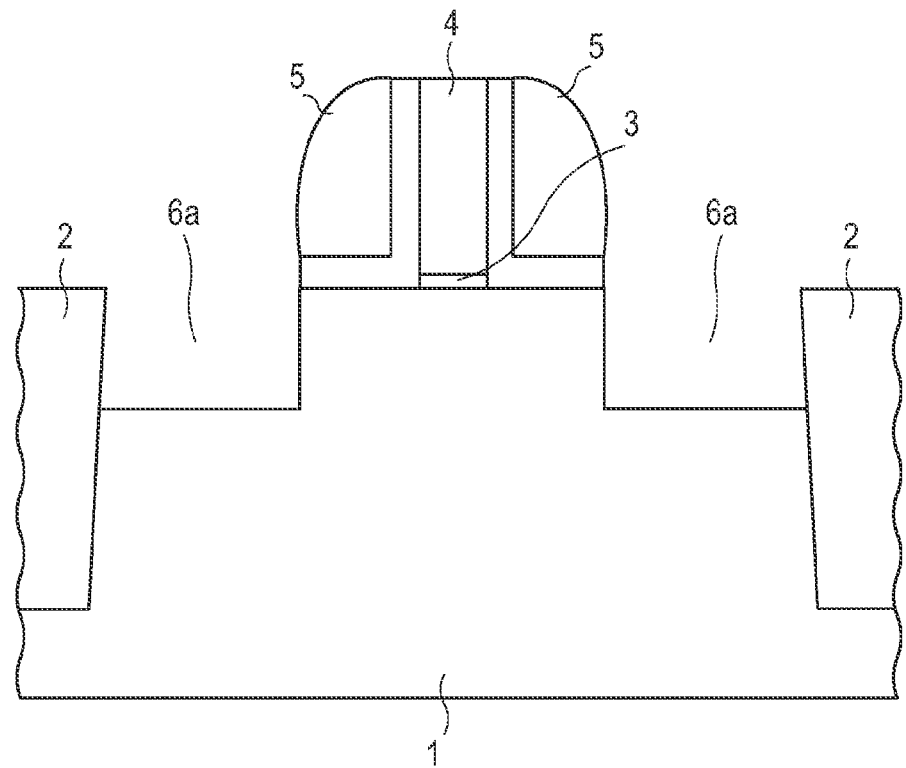
FIG. 4 illustrates a step of first recess formation.
Figure 5:
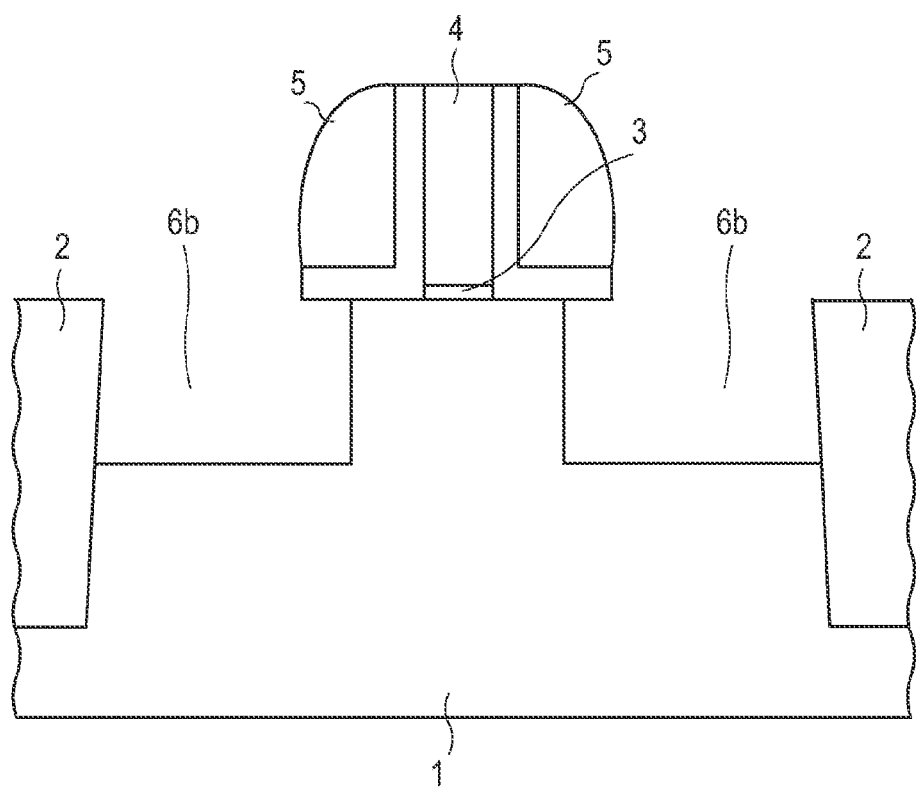
FIG. 5 illustrates a step of second recess formation.

FIG. 1 illustrates one example of a flow of forming a p-channel type MOSFET (pMOSFET). FIGS. 2 to 6 are process drawings illustrating the way the pMOSFET is formed, wherein FIG. 2 is a cross-sectional view of a step of gate electrode formation, FIG. 3 is a cross-sectional view of a step of sidewall spacer formation, FIG. 4 is a cross-sectional view of a step of first recess formation, FIG. 5 is a cross-sectional view of a step of second recess formation, and FIG. 6 is a cross-sectional view of a step of semiconductor layer formation.

As illustrated in FIG. 2, an element-isolating region 2 is formed over a silicon substrate (Si substrate) 1 using a Shallow Trench Isolation (STI) method or the like. A gate insulating film 3 and a gate electrode 4 are formed over an element region of the Si substrate 1 defined by the element-isolating region 2 (S1).

The gate insulating film 3 is, for example, a 1 nm to 2 nm-thick silicon oxide film, silicon nitride film, silicon oxynitride film or hafnium oxide film. The gate electrode 4 is, for example, a polysilicon film or a metal film containing a p-type dopant, such as boron (B).

When the gate insulating film 3 and the gate electrode 4 illustrated in FIG. 2 are formed, a SiO film or a polysilicon film, for example, is formed over the entire surface of the Si substrate 1, and then subjected to patterning by etching, thereby forming the gate insulating film 3 and the gate electrode 4. A dopant of a predetermined conductivity type may be implanted into the Si substrate 1 before or after the formation of the gate insulating film 3, in order to adjust the threshold value of the MOSFET.

As illustrated in FIG. 3, one layer or two or more layers of an insulating film, such as a silicon oxide film, a silicon nitride film or a silicon oxynitride film, are formed over the entire surface of the Si substrate after the formation of the gate electrode 4. Then, the insulating film is etched back to form a sidewall spacer 5 over the gate electrode 4 (S2). In the present example, a silicon oxide film and a silicon nitride film are laminated in sequence, and then etched back to form a sidewall spacer 5 (sidewall spacers 5a and 5b) having a two-layer structure.

As illustrated in FIG. 4, after the formation of the sidewall spacer 5, a first recess 6a is formed in the Si substrate 1 on both sides of the gate electrode 4 (S3). The first recess 6a is formed by, for example, dry etching, such as plasma etching, using an etching gas containing fluorine (F) or the like, to a depth of, for example, 10 nm to 60 nm.

As illustrated in FIG. 5, a surface layer part of the Si substrate in the first recess 6a is removed by wet etching after the formation of the first recess 6a, thereby forming a second recess 6b (S4).

If the first recess 6a is formed in the Si substrate 1 by dry etching, as illustrated in FIG. 4, constituents of the etching gas may remain over the surface of the first recess 6a or crystalline disorder maybe caused by etching (etching damage layer) over the surface layer part. Wet etching, for example, is performed on such a first recess 6a as described above to remove the surface layer part of the first recess 6a to a predetermined amount, thereby forming a second recess 6b, as illustrated in FIG. 5. Constituents of the etching gas present over a surface of the first recess 6a after dry etching or an etching damage layer produced at the surface layer part of the first recess 6a due to dry etching is removed by wet etching.

Etching performed to form the second recess 6b is not limited to wet etching, but may be dry etching. In the present embodiment, however, an explanation will be made by taking wet etching as an example. The etching amount of the surface layer part of the first recess 6a by wet etching is set as appropriate, according to dry etching conditions at the time of forming the first recess 6a. For example, the etching amount of the surface layer part of the first recess 6a maybe set to the depth of etching damage due to the dry etching extends. In the present embodiment, the etching amount was set to, for example, approximately 5 nm to 10 nm. The etching amount of the surface layer part of the first recess 6a is controlled by etching time, during which the Si substrate 1 after the formation of the first recess 6a is exposed to an etchant, and by the temperature of the etchant.

For the wet etching intended to form the second recess 6b, it is possible to use, for example, an oxidizing agent having oxidizing power with respect to Si and an etchant containing an ingredient for removing oxides of Si oxidized by the constituents of the oxidizing agent. Examples of the etchant include a solution containing a hydrogen peroxide ($H_2O_2$) as the oxidizing agent and an inorganic alkali, such as ammonia ($NH_3$). As the etchant, it is possible to use, for example, a solution containing a hydrogen peroxide 0.1% to 4.0% in concentration and ammonia 0.1% to 2.0% in concentration. The temperature of the etchant is set to, for example, approximately 25° C. to 80° C.

In the case of such an etchant as described above, the etching progresses by way of the Si of a surface of the first recess 6a being oxidized by an oxidizing agent, such as a hydrogen peroxide, and an oxide of the Si being removed by an inorganic alkali, such as ammonia. Accordingly, even if irregularities are present in a surface layer part of the first recess 6a formed by dry etching, it is possible to suppress the irregularities. As a result, it is possible to form the second recess 6b excellent in the planarity of a bottom face and sidewalls.

In the case of such an etchant as described above, the etching progresses without causing the etchant to infiltrate deep into the Si substrate 1. Thus, it is possible to satisfactorily maintain the post-etching crystallinity of Si in the surface layer part of the second recess 6b.

Such an etchant as described above isotropically etches Si crystal. Accordingly, it is possible to etch Si in the surface layer part of the first recess 6a in whole to a given amount and remove etching damage present in the first recess 6a before wet etching.

If a technique is used in which etching progresses anisotropically, regardless of whether wet etching or dry etching, for the formation of the second recess 6b, etching damage caused at the time of forming the first recess 6a may partially remain even after etching. For this reason, the second recess 6b is desirably formed by isotropic etching or by a combination of anisotropic etching and isotropic etching.

After the formation of the second recess 6b, there is performed, for example, a treatment using a solution containing fluorinated acid (HF) (S5). This treatment removes a natural oxide film which is possibly formed over a surface of the second recess 6b or contaminants which are possibly attached to the surface of the second recess 6b. The solution containing fluorinated acid preferably has such a composition as to selectively dissolve oxides of Si, such as a natural oxide film, but not to dissolve Si itself.

As illustrated in FIG. 6, a semiconductor layer to function as the source/drain of a pMOSFET is formed in the second recess 6b. Here, a silicon germanium (SiGe) layer 7 different in lattice constant from the Si substrate 1 is epitaxially grown in the second recess 6b (S6).

The SiGe layer 7 is epitaxially grown in the second recess 6b using, for example, a reduced-pressure CVD method. As Si raw material, silane ($SiH_4$), disilane ($Si_2H_6$) or dichlorosilane ($Si_2H_2Cl_2$), for example, is used. As a Ge raw material, germane ($GeH_4$) or digermane ($Ge_2H_6$), for example, is used.

A method for doping a p-type dopant, such as boron (B), into the SiGe layer 7 concurrently with the epitaxial growth of the SiGe layer 7 is called an in-situ doping method. In the in-situ doping method, a diborane ($B_2H_6$) gas, for example, which is a p-type dopant raw material, is further added to a raw material gas for the SiGe layer. Note that the p-type dopant may also be doped using an ion implantation method after the formation of the SiGe layer 7.

In order to suppress SiGe growth on the element-isolating region 2 and on the sidewall spacer 5 and let the SiGe layer 7 selectively undergo epitaxial growth in the second recess 6b, a halogenated gas, such as hydrogen chloride (HCl), may be added to the Si raw material gas and the Ge raw material gas. When the SiGe layer 7 is selectively subjected to epitaxial growth in the second recess 6b, the SiGe layer 7 (source/drain) and the gate electrode 4 are electrically isolated from each other through the sidewall spacer 5. Consequently, it is possible to suppress a leakage current between the SiGe layer 7 and the gate electrode 4.

If the additive amount of the halogenated gas increases, the growth selectivity of the SiGe layer 7 with respect to the second recess 6b tends to become higher. On the other hand, if the additive amount of the halogenated gas increases, a partial growth delay may occur in the SiGe layer 7 and, therefore, the morphology thereof may deteriorate. Accordingly, it is preferable to adjust the additive amount of the halogenated gas as appropriate in the growth process of the SiGe layer 7.

The SiGe layer 7 may be formed so that a Ge concentration within the second recess 6b is uniform. Alternatively, the SiGe layer 7 may be formed so as to have such a concentration gradient that the Ge concentration gradually varies in the depth direction of the second recess 6b. Still alternatively, the SiGe layer 7 may be formed by laminating SiGe layers having different Ge concentrations, for example, by interposing a low-Ge concentration layer midway through the SiGe layers.

By previously wet-etching and removing the surface layer part of the first recess 6a formed by dry etching and forming the second recess 6b, it is possible to perform the epitaxial growth of the SiGe layer 7 under a relatively low-temperature condition of 450° C. or higher but not higher than 600° C.

If the epitaxial growth of the SiGe layer 7 is performed under a temperature condition of lower than 450° C., the decomposition of Si raw material, such as silane, in a surface of the second recess 6b becomes impaired.

If the epitaxial growth of the SiGe layer 7 is performed under a temperature condition of higher than 600° C., the critical film thickness of the SiGe layer 7 decreases and a misfit dislocation is liable to occur within the SiGe layer 7. If a misfit dislocation occurs within the SiGe layer 7, a strain within the SiGe layer is alleviated, thus weakening a stress to be applied to the Si substrate 1 (channel region) in a region below the gate electrode 4. Furthermore, under temperature conditions above 600° C., a dopant diffuses due to heat in cases where the dopant has been introduced into the Si substrate 1 or the gate electrode 4. This diffusion may cause degradation in device performance, such as the degradation of a roll-off characteristic or the depletion of the gate electrode 4.

For such reasons as described above, the SiGe layer 7 is desirably grown under a low temperature condition of 450° C. or higher but not higher than 600° C. The technique of wet-etching and removing the surface layer part of the first recess 6a formed by dry etching to form the second recess 6b allows for the low-temperature growth of the SiGe layer 7.

Now, an explanation will be made of a case in which a recess having a predetermined depth is formed in the Si substrate 1 by dry etching and the SiGe layer 7 is epitaxially grown in the recess, without forming the second recess 6b.

FIG. 7A is a plan view taken from the upper surface of an Si substrate after the SiGe layer 7 is formed under a growth temperature of 550° C., FIG. 7B is a plan view taken from the upper surface of the Si substrate after the SiGe layer 7 is formed under a growth temperature of 575° C., and FIG. 7C is a plan view taken from the upper surface of the Si substrate after an SiGe layer 7 is formed under a growth temperature of 600° C. Note that the growth conditions of the SiGe layers 7 illustrated in FIGS. 7A to 7C are the same except the growth temperatures thereof.

As illustrated in FIG. 7A, a defect (morphologically-deteriorated site) 10, in which the SiGe layer 7 caved in partially, occurred in the vicinity of a sidewall spacer 5 provided on a sidewall of a gate electrode 4, when the SiGe layer 7 was epitaxially grown in a recess formed in the Si substrate 1 by dry etching at a growth temperature of 550° C. using a reduced-pressure CVD method. As illustrated in FIG. 7B, a morphologically-deteriorated site 10 also occurred in the SiGe layer 7 in the vicinity of the sidewall spacer 5, when the SiGe layer 7 was epitaxially grown in the recess formed in the Si substrate 1 by dry etching at a growth temperature of 575° C. On the other hand, as illustrated in FIG. 7C, no morphologically-deteriorated sites were observed when the SiGe layer 7 was epitaxially grown in the recess formed in the Si substrate 1 by dry etching at a growth temperature of 600° C.

It is conceivable that if a recess is formed in the Si substrate 1 by dry etching, etching damage is present in a surface layer part of the recess. According to FIGS. 7A to 7C, the surface condition of the Si substrate in the recess is considered to affect the growth of the SiGe layer 7 more significantly if the SiGe layer 7 is epitaxially grown at lower temperatures. Thus, the surface condition is considered liable to deteriorate the morphology of the SiGe layer 7 thus obtained. Such a morphological deterioration may degrade the characteristics of a pMOSFET or increase a variation in the characteristics. Thus, the morphological deterioration may be a problem in terms of both characteristics and yields.

On the other hand, if the SiGe layer 7 is epitaxially grown at high temperatures, the effect of the surface condition of the recess on the growth of the SiGe layer 7 is suppressed. Thus, it is possible to obtain the SiGe layer 7 of excellent morphology. However, misfits are more liable to occur within SiGe with an increase in the growth temperature of the SiGe layer 7. In addition, the thermal diffusion of dopants within the Si substrate is also liable to occur. Evaluation of a device in which the SiGe layer 7 was epitaxially grown at a growth temperature of 600° C. proved a degradation in the required characteristics of the device, though the SiGe layer 7 of excellent morphology was obtained.

Now, an explanation will be made of a case in which a surface layer part of the first recess 6a was removed by wet etching after the formation of the first recess 6a by dry etching to form a second recess 6b, and then an SiGe layer 7 was epitaxially grown.

An etching amount at the time of forming the second recess 6b was changed and an SiGe layer 7 was epitaxially grown. FIG. 8 shows one example of a relationship between an etching time and an etching amount.

As shown in FIG. 8, the etching amount when Si is wet-etched using an etchant containing ammonia and hydrogen peroxide tends to increase linearly as the etching time involving exposure to the etchant increases. When the temperature of the etchant is increased, the gradient of etching rate increases and when the etchant is set to a low temperature, the etching rate decreases. Thus, the etching amount of Si may be controlled by the etching time and the etchant temperature.

The etching time and the etchant temperature were controlled, in order to control the etching amount in a step of forming a second recess to 1 nm, 5 nm and 7 nm, respectively. For the respective etching amounts, SiGe layers 7 were epitaxially grown under the same growth conditions using a reduced-pressure CVD method. The growth temperature of the SiGe layers 7 was set to 550° C. Note that the etching amount was actually measured by observing the cross sections of samples with a transmission electron microscope (TEM) before and after wet etching.

FIG. 9A is a plan view of a sample in which the SiGe layer was grown after the 1-nm etching of Si, FIG. 9B is a plan view of a sample in which the SiGe layer was grown after the 5-nm etching of Si, and FIG. 9C is a plan view of a sample in which an SiGe layer was grown after the 7-nm etching of Si.

In FIG. 9A, morphologically-deteriorated sites 10 occurred in the SiGe layer 7. On the other hand, no morphologically-deteriorated sites were observed in FIGS. 9B and 9C.

When the etching amount was 1 nm, etching damage caused at the time of forming the first recess 6a remained without being fully removed. Thus, the morphology of the SiGe layer 7 deteriorated. On the other hand, when the etching amounts were 5 nm and 7 nm, etching damage caused at the time of forming the first recess 6a was fully removed. Thus, the morphological deterioration of the SiGe layer 7 was suppressed.

From the viewpoint of removing etching damage, wet etching may be performed by setting the amount of etching from the first recess 6a formed by dry etching to 5 nm or larger, and then a second recess 6b may be formed. If the second recess 6b is formed by setting the amount of etching from the first recess 6a to 5 nm or larger, it is possible to effectively remove etching damage caused in the surface layer part of the first recess 6a. Accordingly, it may be said that an SiGe layer 7 of excellent morphology may be epitaxially grown in the second recess 6b even under a low-temperature growth condition of 450° C. or higher but not higher than 600° C.

Note that the amount of etching from first recess 6a at the time of forming the second recess 6b is preferably 5 nm or larger. On the other hand, the etching time becomes longer with an increase in the etching amount, or there arises the need to further raise the etchant temperature. In addition, there is the possibility, depending on the configuration of the device, that such dissolution as to induce the characteristic degradation of the device occurs in portions separate from the first and second recesses 6a and 6b due to a prolonged etching time or an elevated etchant temperature. The etching amount is preferably set on the basis of the productivity and required characteristics of such a device as described above, in addition to the morphology of the SiGe layer 7 as described above. For example, the etching amount is preferably set to approximately 5 nm or larger but not larger than 10 nm. In addition, it is possible to fully remove etching damage if the etching amount is approximately 5 nm or larger but not larger than 10 nm.

In the above-described embodiment, a case has been cited in which the surface layer part of the first recess 6a formed by dry etching was removed to a predetermined etching amount by wet etching using an etchant containing hydrogen peroxide and ammonia, thereby forming the second recess 6b. For this wet etching, it is also possible to use ozone water in place of the hydrogen peroxide. In addition, it is possible to use an inorganic alkali, such as potassium hydroxide (KOH), sodium hydroxide (NaOH), or hydrogen water admixed with ammonia, in place of the ammonia.

It is also possible to combine wet etching using an etchant containing an inorganic alkali and wet etching using an etchant containing an organic alkali to remove the surface layer part of the first recess 6a to a predetermined etching amount, thereby forming the second recess 6b. As the organic alkali, tetramethylammonium hydroxide (TMAH) or the like is used.

In the case of an etchant containing an organic alkali such as TMAH or the like, etching progress anisotropically with respect to specific crystals of the Si substrate 1. Therefore, there is the possibility that etching damage remains partially in the surface layer part of the second recess 6b. Accordingly, when an etchant containing an organic alkali is used, it is preferable that, for example, wet etching using an etchant containing an inorganic alkali is performed after the wet etching using the etchant containing the organic alkali. Alternatively, wet etching using an etchant containing an organic alkali may be performed after wet etching using an etchant containing an inorganic alkali.

In the above-described embodiment, an explanation has been made by citing a case in which the SiGe layer 7 is epitaxially grown in the second recess 6b formed in the Si substrate 1 as a semiconductor layer. Alternatively, a silicon germanium carbide (SiGeC) layer may be epitaxially grown in the second recess 6b as the semiconductor layer. With this SiGeC layer, as with the SiGe layer, it is possible to apply a compressive stress to a channel region of a pMOSFET to improve the hole mobility of the channel region, thereby improving the current driving capability of the pMOSFET.

Although in the above-described embodiment, an explanation has been made by citing a case in which a pMOSFET is formed, the above-described technique is also applicable when an n-channel type MOSFET (nMOSFET) is formed.

That is, in a process of forming an nMOSFET, a gate electrode 4 is formed over the Si substrate 1 through a gate insulating film 3 (S1, FIG. 2), a sidewall spacer 5 is formed (S2, FIG. 3), and then a first recess 6a is formed by dry etching (S3, FIG. 4). Next, wet etching is performed to remove a surface layer part of the first recess 6a in which etching damage has been caused by dry etching, and a second recess 6b is formed (S4, FIG. 5). After the formation of the second recess 6b, a fluorinated acid treatment or the like may be performed (S5).

In the case of the nMOSFET, a silicon carbide (SiC) layer is epitaxially grown in the formed second recess 6b in place of the SiGe layer 7 illustrated in FIG. 6 to function as a source/drain. The SiC layer may be doped with an n-type dopant, such as phosphorous (P) or arsenic (As), using, for example, an in-situ doping method.

A compound semiconductor substrate or a Silicon-On-Insulator (SOI) substrate may be used in place of the Si substrate 1.

There may further be carried out wet etching on the Si substrate 1 after the formation of the first recess 6a, whereby a natural oxide film formed over the Si substrate 1 is removed or contaminants, such as particles and metal impurities, attached to a surface of the Si substrate 1 are removed by performing only a treatment using a solution for selectively dissolving Si oxides rather than Si, such as a fluorinated acid solution.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device, comprising:
    forming a gate insulating film over a first semiconductor layer;
    forming a gate electrode over the gate insulating film;
    forming an insulating film over the first semiconductor layer and the gate electrode;
    etching the insulating film and exposing the first semiconductor layer to form a sidewall spacer on the sidewall of the gate electrode;
    etching the first semiconductor layer to form a first recess in the first semiconductor layer on both sides of the gate electrode by dry etching using the gate electrode and the sidewall spacer as masks;
    forming a second recess by removing a bottom and sidewalls of the first semiconductor layer in the first recess by wet etching; and
    forming a second semiconductor layer in the second recess;
    wherein the wet etching is performed using an etchant containing an oxidizing agent for oxidizing the first semiconductor layer and an inorganic alkali;
    wherein forming the second semiconductor layer is performed by epitaxially growing the second semiconductor layer at a temperature of 450° C. to 600° C.

2. The method of manufacturing a semiconductor device according to claim 1, wherein the oxidizing agent is hydrogen peroxide and the inorganic alkali is ammonia.

3. The method of manufacturing a semiconductor device according to claim 1, wherein an etching damage layer formed at the bottom and the sidewall of the first recess is removed by the wet etching.

4. The method of manufacturing a semiconductor device according to claim 1, wherein an etching amount of the bottom and the sidewall of the first recess by the wet etching is 5 nm to 10 nm.

5. The method of manufacturing a semiconductor device according to claim 1, further comprising:

removing Si oxide formed at a bottom and sidewalls of the second recess using a solution, after forming the second recess and before forming the second semiconductor layer.

6. The method of manufacturing a semiconductor device according to claim 5, wherein the solution contains fluorinated acid.

7. The method of manufacturing a semiconductor device according to claim 1, wherein the second semiconductor layer has a second lattice constant different from a first lattice constant of the first semiconductor layer.

* * * * *